United States Patent [19]

Wilson et al.

[11] Patent Number: 4,714,837
[45] Date of Patent: Dec. 22, 1987

[54] HIGH SPEED FLIP-FLOP

[75] Inventors: Bart A. Wilson, Salt Lake City; Vaughn J. Jenkins, Bountiful; Dale D. Fonnesbeck, Daysville, all of Utah

[73] Assignee: Sperry Corporation, Blue Bell, Pa.

[21] Appl. No.: 886,916

[22] Filed: Jul. 18, 1986

[51] Int. Cl.4 .............................................. H03K 3/286
[52] U.S. Cl. .................................. 307/289; 307/268; 307/291; 328/206
[58] Field of Search .................. 307/272 R, 289, 291, 307/268; 328/164, 195, 196, 206

[56] References Cited

U.S. PATENT DOCUMENTS

| 3,912,951 | 10/1975 | Kihara | 307/289 |
| 4,021,685 | 5/1977 | Goodall et al. | 307/268 |
| 4,153,848 | 5/1979 | Miyazaki | 307/268 |
| 4,277,699 | 7/1981 | Brown et al. | 307/291 |

Primary Examiner—John Zazworsky
Attorney, Agent, or Firm—G. Donald Weber, Jr.; Glenn W. Bowen; Laurence J. Marhoefer

[57] ABSTRACT

A high speed, edge-triggered, set/reset flip-flop of relatively simple circuit configuration which operates on small, narrow pulses.

10 Claims, 2 Drawing Figures

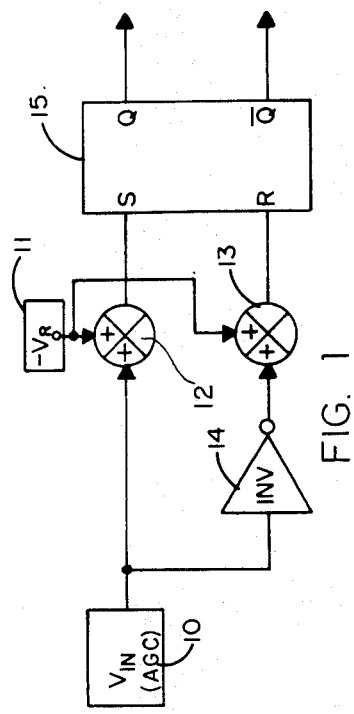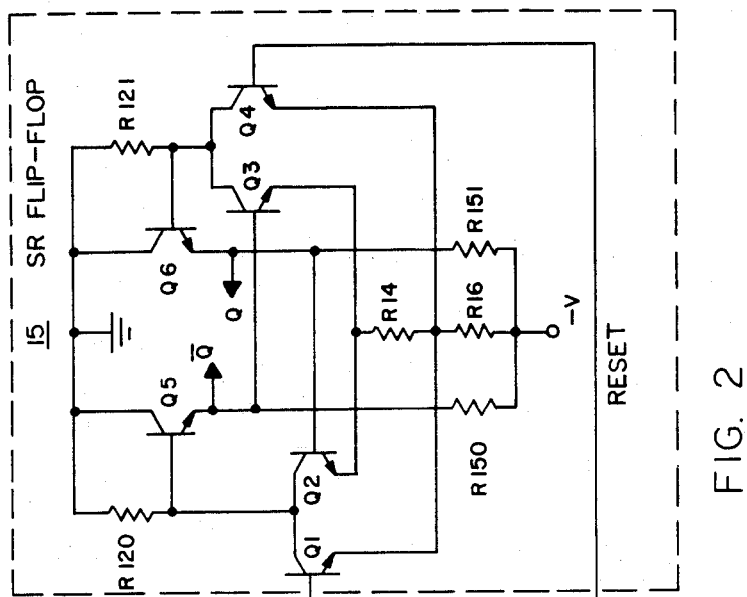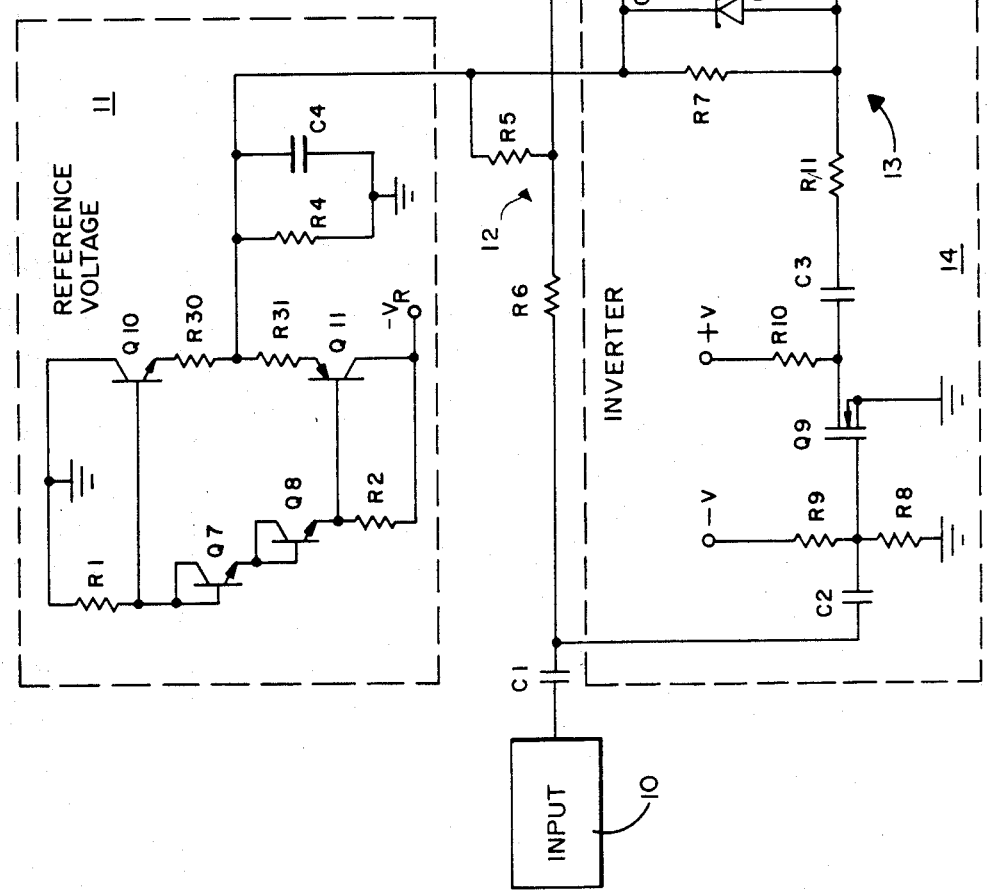
FIG. 1
FIG. 2

HIGH SPEED FLIP-FLOP

BACKGROUND

1. Field of the Invention

This invention is directed to a flip-flop circuit, in general, and to a high speed flip-flop circuit which is triggered by the leading edge of signals and operates on low amplitude, narrow width pulses to produce discernible output signals, in particular.

2. Prior Art

There are many instances known in the art wherein a flip-flop or similar triggered circuit is required to detect signals with small amplitude pulses and to convert these pulses into signals which can be detected with a degree of reliability and certainty at the output of the circuit. This situation is complicated if the pulses have a narrow width. These known circuits can be in the nature of flip-flops, one-shots or the like.

In the past, a typical circuit for producing this operation was a Fairchild circuit of the 100K series which operates on an ECL type of operation. These circuits have also been characterized as line drivers, line receivers or the like.

However, these circuits are generally limited in the speed of operation thereof inasmuch as the rise and fall times of the pulses require on the order of three to five nanoseconds. While this is a relatively short time, it is also a limitation on the operation of the circuits. That is, the throughput of the system is limited by the rise and fall time of pulses which can be detected.

In the known circuitry, the operating time is considered to be relatively slow when compared to many other high speed operations, for example in fiber optic systems which can operate at the rate of forty or fifty megabits per second. The rise or fall times for these pulses are far less than three to five nanoseconds. Consequently, the high speed optic (and other) signal transmission systems would not operate or function properly. Therefore, higher speed circuits are necessary.

SUMMARY OF THE INVENTION

The circuit of this invention comprises a Set/Reset (SR) flip-flop. An input circuit is connected directly to one input of the flip-flop and provides a Set signal thereto. The input is also connected via an inverter to another input of the flip-flop to provide a Reset signal. A reference voltage source is connected to the inputs of the flip-flop in order to provide appropriate voltage level shifting thereto.

The circuit includes high speed operating components so that the circuit can produce output signals having rise and fall times on the order of one (1) nanosecond.

BRIEF DESCRIPTION OF THE DRAWINGS

FIG. 1 is a simplified block diagram of the circuit in the instant invention.

FIG. 2 is a schematic diagram of the circuit of the instant invention.

DESCRIPTION OF A PREFERRED EMBODIMENT

Referring now to FIG. 1, there is shown a functional block diagram of the instant invention. The input device 10 can be any suitable source of input signals. For example, the input 10 can represent a fiber optic system, in particular the AGC amplifier which produces the signals which are transmitted through the optical fiber. This signal is represented by the signal $V_{IN}$.

The input source 10 is connected to an input of inverter 14 and to one input of a summer 12. The output of inverter 14 is supplied an input of a summer 13. The summers 12 and 13 can be any suitable summing devices or circuit arrangements.

A source 11 produces a reference bias voltage $V_R$. In particular, the reference voltage may be a negative voltage if the logic circuitry in the invention so requires. This is, typically, the case in ECL circuitry.

The output of the summer 12 is supplied to the set input S of a flip-flop 15. The output of the summer 13 is supplied to the reset terminal R of flip-flop 15. The output terminals of flip-flop 15 are the Q and $\bar{Q}$ output terminals.

In operation, the input source 10 supplies the input signals which are to be operated upon by the circuit. In the application involved herein, it is anticipated that the input signals will be relatively small amplitude (for example about 300 to 700 millivolts) with relatively narrow pulse width (for example on the order of 1.0 nanoseconds). In the typical operation, the signals exhibit a binary coding arrangement. In particular, a positive going signal represents a binary 1 while a negative going signal represents a binary 0.

The input signal is supplied through inverter 14 so that complementary signals are supplied to the summers 12 and 13. That is, a positive going input signal produces a positive going signal at the input of summer 12 while a negative going signal is supplied to the input of summer 13.

The signals supplied to summers 12 and 13 are added to, or combined with, the reference signal supplied by reference source 11. This operation causes the signals supplied by the summers to the flip-flop to be properly shifted in amplitude level thereby to operate with the logic circuit arrangement of flip-flop 15.

In a typical application, flip-flop 15 is a high-speed ECL flip-flop which is arranged to "set" with a binary 1 signal on the S input and reset or clear with a binary 1 signal on the R input. In the set condition, the Q terminal produces a binary 1 output signal. In the reset condition, a binary 0 output signal is produced on the Q terminal. In each case, the $\bar{Q}$ signal is the complement of the signal on the Q terminal.

Referring now to FIG. 2, there is shown a detailed schematic diagram of the circuit shown in FIG. 1. In FIG. 2, similar components bear similar reference numerals.

For example, the reference source 11 is of substantially conventional design and includes transistors Q7 through Q11. In particular, the conduction path of transistor Q10 is connected in series with the conduction path of transistor Q11 between ground and the reference potential $-V$ (described above). Resistors R30 and R31 are connected in series between the conduction paths of transistors Q10 and Q11 to provide temperature stability. The junction between these resistors, which, in a preferred embodiment, are balanced is connected to an output filter network comprising resistor R4 and capacitor C4 which are connected in parallel to each other and referenced to ground. Resistor R4 represents the load for the source while capacitor C4 removes ripple from the output reference signal. In addition, the common junction provides the output terminal for the voltage source 11 and is connected to each of the summer junctions 12 and 13.

The resistors R1 and R2 are connected in series with a pair of diode-connected transistors Q7 and Q8 to provide the appropriate biasing potential at the base electrodes of transistors Q10 and Q11, respectively, thereby to determine the output reference voltage. Alteration of the reference voltage signal is obtained by altering the values of resistors R1 and R2. The transistors Q7 and Q8 also provide a temperature compensation arrangement for the reference voltage circuit especially as related to the flip-flop circuit.

The input source 10 is coupled to the summer junction 12 via coupling capacitor C1 and resistor R6. Resistor R5 is connected between the junction 12 and the reference voltage source 11. In addition, coupling capacitor C1 couples the input signal to the inverter 14 which includes a coupling capacitor C2 which is connected to the base of transistor Q9. In a preferred embodiment, transistor Q9 is a GaAs transistor which is capable of extremely high operating speed as well as wide band operation.

In addition, the voltage network comprising resistors R8 and R9 is connected between ground and voltage −V (supplied by an external voltage source). The common junction between resistors R8 and R9 is also connected to the gate electrode of transistor Q9 to provide the bias voltage therefor. The source electrode of transistor Q9 is connected to ground.

The drain electrode of transistor Q9 is connected to a pull-up resistor R10 which is connected to source +V (also supplied by an external source, not shown). The drain electrode of transistor Q9 is also connected to the summer junction 13 via DC filtering capacitor C3 and resistor R11. The junction 13 between resistor R11 and resistor R7 forms the summing junction as described above. The other end of resistor R7 is connected to resistor R5 and joined together at the common output terminal of reference voltage source 11. It will be recognized that resistors R5 and R7 are relatively high impedance in order to avoid loading the circuits.

A pair of high speed Schottky diodes CR2 and CR1 are connected, head-to-tail, across resistor R7 and act as clamping diodes to prevent the voltage at node 13 from exceeding the prescribed limits, as described hereinafter. This arrangement instability also avoids in the operation of the flip-flop circuit.

The SET input of flip-flop 15 is connected the summer junction 12 while the RESET input of flip-flop 15 is connected the summer junction 13.

The SET terminal of flip-flop 15 is connected at the base electrode of transistor Q1. The RESET terminal of flip-flop 15 is connected at the base electrode of transistor Q4.

The emitter electrodes of transistors Q1 and Q4 are connected together and to the reference voltage −V via resistor R16. The collector electrodes of transistors Q1 and Q4 are connected to ground via matching current limiting resistors R120 and R121. In addition, the collector electrode of transistor Q1 is connected to the base electrode of transistor Q5 and to the collector electrode of transistor Q2. The collector electrode of transistor Q5 is connected to ground while the emitter electrode of transistor Q5 is connected to the −V source via pull down resistor 150. The emitter electrode of transistor Q5 is also connected to the base electrode of transistor Q3 which has the collector electrode thereof connected to the collector electrode of transistor Q4 and, via resistor R121 (which is matched to resistor R120), to ground. The base electrode of transistor Q6 is also connected to the collector electrode of transistor Q3 while the collector electrode of transistor Q6 is connected to ground. The emitter electrode of transistor Q6 is connected to the base electrode of transistor Q2 and to source −V via pull down resistor 151. The emitter electrodes of transistors Q2 and Q3 are connected together and, via resistor R14, to the common junction of the emitter electrodes of transistors Q1 and Q4 noted above.

The output terminals Q and $\bar{Q}$ of flip-flop 15 are connected at the emitter electrodes of transistors Q6 and Q5, respectively.

While not necessarily limited thereto, all of the transistors in the flip-flop circuit are silicon, bipolar transistors, which are extremely fast operating transistors in order to obtain the 1 nS rise and fall times.

In operation, the reference voltage source 11 is operative to produce an output voltage of approximately −1.0 volts. Of course, in different applications, different voltage levels may be produced. In addition, the input source 10 which, in one application can be an AGC amplifier from a fiber optic digitizer circuit, produces a signal having a amplitude of between 300 and 700 mV.

The signal from the input circuit is supplied via coupling capacitor C1 to the summer junction 12. Concurrently, the input signal is supplied via coupling capacitor C2 to the GaAs field effect transistor Q9 and via coupling capacitor C3 to summer junction 13. The coupling capacitors also have the effect of "de-coupling" the GaAs FET bias signals from the flip-flop inputs. The capacitor C3 and resistor R11 are selected to pass the pulses produced by transistor Q9 rapidly while blocking the DC signal components. Also, there should be no significant delay in passing the signal or the RESET signal will be delayed and disadvantageously impact operation of the flip-flop. The operation of the transistor Q9 circuit and the associated components is to invert the input signals supplied thereto. Consequently, the summer junction 12 produces an output signal of approximately −0.7 volts and the summer junction 13 produces an output signal of approximately −1.3 volts. (That is, the −1.0 volt signal from the reference voltage source is added to the 300 mV and −300 mV signals produced at the summer junction.) These signals are then supplied to the SET and RESET terminals respectively, of flip-flop 15.

In essence, the signal supplied to the SET terminal causes transistor Q1 to be turned on while transistor Q4 is turned off (or turned off further) by the RESET signal. When transistor Q1 begins operation, current is drawn through resistor R120 wherein transistor Q5 is effectively turned off. This produces a low level signal at the $\bar{Q}$ output terminal and also causes transistor Q3 to be turned off. With transistors Q3 and Q4 turned off, transistor Q6 is turned on and produces a relatively high level signal at the Q output terminal and at the base electrode of transistor Q2. Thus, the circuit is latched in the condition with the relatively positive voltage level or binary 1 at the Q output terminal and the relatively negative or 0 signal at the $\bar{Q}$ output terminal. This condition continues until a positive going signal is supplied to the RESET input terminal.

Upon receipt of a negative going signal from the input source, this input signal is coupled to summing junction 12 and to the inverter 14 by the coupling capacitor C1. Again, inverter 14 inverts the input signal and supplies same to summing junction 13. In this situation, a signal of −1.3 volts is supplied to the SET terminal and a signal of −0.7 volts is supplied to the RESET terminal. These signal conditions cause transistor Q1 to be turned off and transistor Q4 to be turned on. With transistor Q1 turned off, the current through resistor R120 is reduced. Concurrently, when transistor Q4 is turned on, current is drawn through resistor R121. As a consequence, transistor Q6 is turned off while transistor Q5 is turned on. As transistor Q5 is turned on, the potential at terminal $\overline{Q}$ rises to −0.7 volts which has the effect of turning on transistor Q3. With transistor Q3 and Q4 turned on, the current through resistor R121 causes further current flow through resistors R14 and R16 and, through a "current-mirroring" approach, reduces the current in resistor R120.

Thus, the output signals at terminals Q and $\overline{Q}$ are 0 and 1, respectively, which represents the change in the input signal condition.

The Schottky diodes CR2 and CR1 clamp the output of the inverter to within ±0.7 volts of the reference voltage. This keeps the flip-flop 15 from being driven into saturation which would cause the flip-flop to exhibit slower operating speed. The Schottky diodes CR1 and CR2 can be GaAs diodes for greater speed.

Thus, there is shown and described a high speed flip-flop circuit which is capable of operating with small amplitude, narrow width pulses. The flip-flop, in this application, operates on an input signal which is, typically, differentiated and which is level shifted by a reference voltage source. The circuit also makes use of certain GaAs devices to enhance the speed of operation of the circuit. As well, the circuit incorporates temperature compensation to avoid voltage level drift.

While specific components and arrangements have been shown and described, it should be recognized that those skilled in the art may conceive of changes or modifications to the specific circuitry. However, any such changes or modifications which fall within the purview of this description are intended to be included therein as well. That is, this description is intended to be illustrative only and is not intended to be limitative. Rather, the scope of the application is limited only by the claims appended hereto.

We claim:
1. A high speed, edge-triggered flip-flop circuit comprising,
   set/reset flip-flop circuit means,
   source means for supplying input signals,
   inverter means connected to receive said input signals from said source means and to produce inverted input signals,
   reference voltage source means for producing a reference voltage,
   first summing means connected to receive said reference voltage from said reference voltage source means and said input signals from said source means and to provide an output signal representative of the combination thereof to a first input of said flip-flop circuit means, and
   second summing means connected to receive said reference voltage from said reference voltage source means and said inverted input signals from said inverter means and to provide an output signal representative of the combination thereof to a second input of said flip-flop circuit means,
   said first and second summing means comprise resistance networks.
2. The circuit recited in claim 1 wherein,
   each of said first and second summing means are algebraic summing devices.
3. The circuit recited in claim 1 wherein,
   said reference voltage from said reference voltage source means is adapted to raise the voltage level of the combination output signals produced by each of said first and second summing means.
4. The circuit recited in claim 1 wherein,
   said inverter means includes at least one high speed GaAs switching device.
5. The circuit recited in claim 1 wherein,
   said set/reset flip-flop circuit means includes set input transistor means and reset input transistor means having the respective base electrodes connected to said first and second summing means, the respective emitter electrodes connected to a common reference potential source the respective collector electrodes connected to a second common, reference potential source and to cross-coupling means which operate to latch said set input transistor means and said reset input transistor means in opposite conduction states as controlled by the combination output signals supplied by said first and second summing means, respectively.
6. The circuit recited in claim 1 including,
   clamping means connected to said second summing means to limit the level of the output signal produced thereby.
7. The circuit recited in claim 1 wherein,
   said source means includes AGC amplifier means.
8. The circuit recited in claim 5 including,
   first and second switching means connected to be controlled by said set input transistor means and said reset input transistor means, respectively, and to produce complementary output signals.
9. The circuit recited in claim 6 wherein,
   said clamping means comprise Schottky diodes.
10. The circuit recited in claim 8 wherein,
    said first and second switching means comprise transistor circuit means connected between said set input transistor means and said reset input transistor means.

* * * * *